(12) United States Patent
Lai et al.

(10) Patent No.: US 8,368,216 B2
(45) Date of Patent: Feb. 5, 2013

(54) SEMICONDUCTOR PACKAGE

(75) Inventors: Yi-Shao Lai, Kaohsiung (TW);
Tsung-Yueh Tsai, Kaohsiung (TW);
Ming-Kun Chen, Kaohsiung (TW);
Hsiao-Chuan Chang, Kaohsiung (TW);
Ming-Hsiang Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 142 days.

(21) Appl. No.: 12/872,644

(22) Filed: Aug. 31, 2010

(65) Prior Publication Data

US 2012/0049360 A1    Mar. 1, 2012

(51) Int. Cl.
*H01L 23/538* (2006.01)
*H01L 21/60* (2006.01)
*H01L 23/488* (2006.01)

(52) U.S. Cl. ......... 257/738; 257/E23.169; 257/E21.509; 257/737; 257/778; 257/685; 257/777; 257/724; 257/728; 257/784

(58) Field of Classification Search .................. 257/738, 257/737, E21.509, E23.169, 778, 685, 686, 257/777, 724, 728, 784; 438/107
See application file for complete search history.

(56) References Cited

U.S. PATENT DOCUMENTS

| | | | |
|---|---|---|---|
| 6,500,696 B2 | 12/2002 | Sutherland | |
| 6,559,531 B1 | 5/2003 | Sutherland | |
| 6,907,151 B2* | 6/2005 | Yunus | 385/14 |
| 7,425,760 B1 | 9/2008 | Guenin et al. | |
| 7,518,229 B2* | 4/2009 | Cotte et al. | 257/698 |
| 7,545,026 B2* | 6/2009 | Six | 257/676 |
| 7,939,371 B1* | 5/2011 | Chang | 438/108 |
| 7,939,372 B1* | 5/2011 | Chang | 438/108 |
| 2008/0003717 A1* | 1/2008 | Zhou et al. | 438/109 |
| 2009/0085183 A1* | 4/2009 | Mitchell et al. | 257/686 |
| 2010/0258939 A1* | 10/2010 | Heng et al. | 257/737 |
| 2010/0307242 A1* | 12/2010 | Sakai et al. | 73/504.12 |
| 2011/0156243 A1* | 6/2011 | Chang et al. | 257/702 |
| 2011/0233764 A1* | 9/2011 | Chang et al. | 257/737 |
| 2011/0298139 A1* | 12/2011 | Lai et al. | 257/774 |
| 2012/0098089 A1* | 4/2012 | Tago | 257/531 |

\* cited by examiner

*Primary Examiner* — A O Williams
(74) *Attorney, Agent, or Firm* — McCracken & Frank LLC

(57) ABSTRACT

The present invention relates to a semiconductor package having at least one first layer chip, a plurality of first metal bumps, at least one second layer chip and a package body. The first layer chip includes a first active surface upon which the first metal bumps are disposed and a plurality of first signal coupling pads disposed adjacent to the first active surface. The second layer chip is electrically connected to the first layer chip, and includes a second active surface that faces the first active surface and a plurality of second signal coupling pads. The second signal coupling pads are capacitively coupled to the first signal coupling pads so as to provide proximity communication between the first layer chip and the second layer chip. The package body encapsulates the first layer chip, the first metal bumps, and the second layer chip, and the first metal bumps are partially exposed.

20 Claims, 5 Drawing Sheets

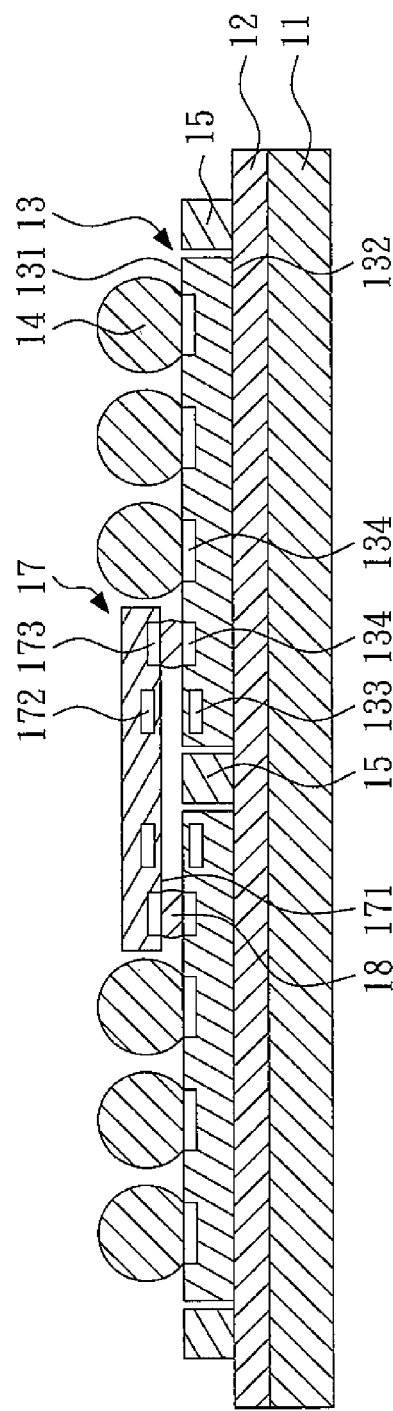
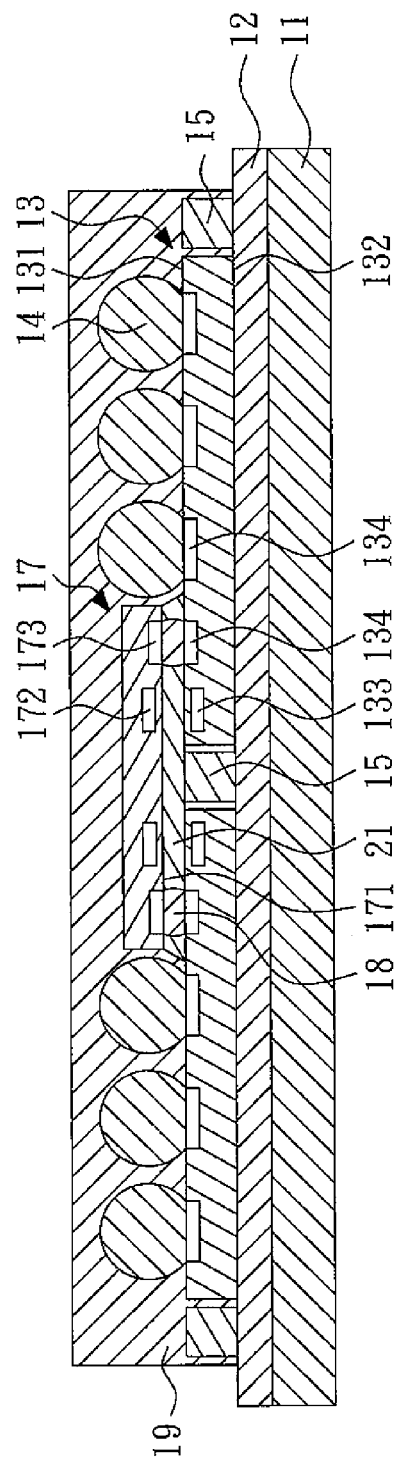
FIG. 4
FIG. 5

SEMICONDUCTOR PACKAGE

BACKGROUND OF THE INVENTION

1. Field of the Invention

The present invention relates to a semiconductor package and a method for making the same, and more particularly to a semiconductor package having signal coupling pads and a method for making the same.

2. Description of the Related Art

A new technique referred to as "proximity communication" overcomes the limitations of conductive electrical interconnections by using capacitive coupling to provide communications between two chips. This technique provides higher input/output pads densities than traditional wire-bonding and flip-chip bonding input/output pads (about 100 times greater). To achieve proximity communication, the input/output pads disposed on an active surface of each chip are placed face-to-face with extreme accuracy, and the bonding strength between two chips is weak, so the two chips are separated from each other easily during being mounted to the substrate.

Therefore, it is necessary to provide a semiconductor package and a method for making the same to solve the above problems.

SUMMARY OF THE INVENTION

The present invention is directed to a semiconductor package. The semiconductor package comprises at least one first layer chip, a plurality of first metal bumps, at least one second layer chip and a package body. The first layer chip comprises a first active surface and a plurality of first signal coupling pads. The first signal coupling pads are disposed adjacent to the first active surface. The first metal bumps are disposed on the first active surface of the first layer chip. The second layer chip is electrically connected to the first layer chip, and comprises a second active surface and a plurality of second signal coupling pads. The second active surface faces the first active surface of the first layer chip. The second signal coupling pads are disposed adjacent to the second active surface, and capacitively coupled to the first signal coupling pads of the first layer chip, so as to provide proximity communication between the first layer chip and the second layer chip. The package body encapsulates the first layer chip, the first metal bumps and the second layer chip, and the first metal bumps are partially exposed.

The present invention is further directed to a method for making a semiconductor package. The method comprises the following steps: (a) providing a carrier and a release tape, wherein the release tape is disposed on the carrier; (b) providing at least one first layer chip and a plurality of first metal bumps, wherein the first layer chip has a first active surface, a first back surface and a plurality of first signal coupling pads, the first signal coupling pads are disposed adjacent to the first active surface, and the first metal bumps are disposed on the first active surface of the first layer chip; (c) disposing the first layer chip on the release tape, wherein the first back surface of the first layer chip contacts the release tape; (d) attaching and electrically connecting at least one second layer chip to the first layer chip, wherein the second layer chip has a second active surface and a plurality of second signal coupling pads, the second active surface faces the first active surface of the first layer chip, the second signal coupling pads are disposed adjacent to the second active surface, and capacitively coupled to the first signal coupling pads of the first layer chip, so as to provide proximity communication between the first layer chip and the second layer chip; (e) forming a package body to encapsulate the first layer chip, the first metal bumps and the second layer chip; (f) removing part of the package body so as to expose at least a portion of each of the first metal bumps; and (g) removing the release tape and the carrier.

Whereby, the bonding strength between the first layer chip and the second layer chip is increased because of the package body, so the yield of the semiconductor package is increased.

BRIEF DESCRIPTION OF THE DRAWINGS

FIGS. 1 to 8 are schematic views of a method for making a semiconductor package according to the present invention.

DETAILED DESCRIPTION OF THE INVENTION

Figure 1:
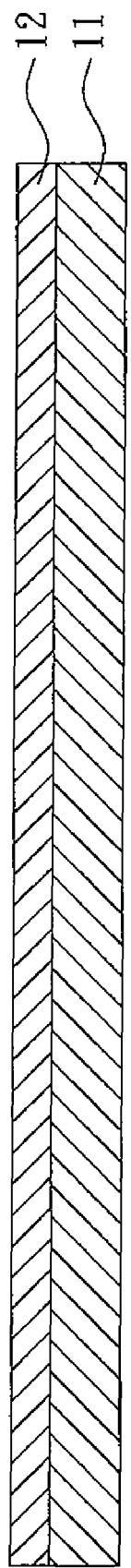

FIGS. 1 to 8 show schematic views of a method for making a semiconductor package according to the present invention. As shown in FIG. 1, a carrier 11 and a release tape 12 are provided. The release tape 12 is disposed on the carrier 11. In the embodiment, the release tape 12 is a thermal release tape.

Figure 2:
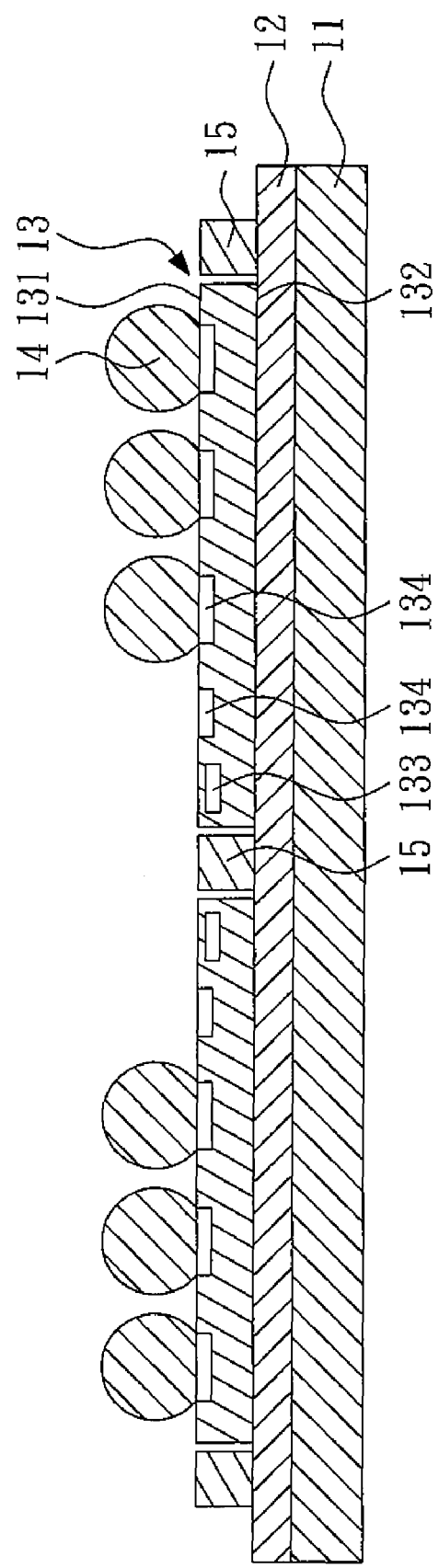

As shown in FIG. 2, at least one first layer chip 13 and a plurality of first metal bumps 14 are provided. The first layer chip 13 has a first active surface 131, a first back surface 132 and a plurality of first signal coupling pads 133. The first signal coupling pads 133 are disposed adjacent to the first active surface 131. The first metal bumps 14 are disposed on the first active surface 131 of the first layer chip 13. In the embodiment, the first layer chip 13 further comprises a plurality of first layer chip pads 134 disposed adjacent to the first active surface 131. The number of the first layer chip 13 is two, the first metal bumps 14 are connected to one end of each first layer chip 13, and the first signal coupling pads 133 are disposed at another end of each first layer chip 13.

Figure 3:
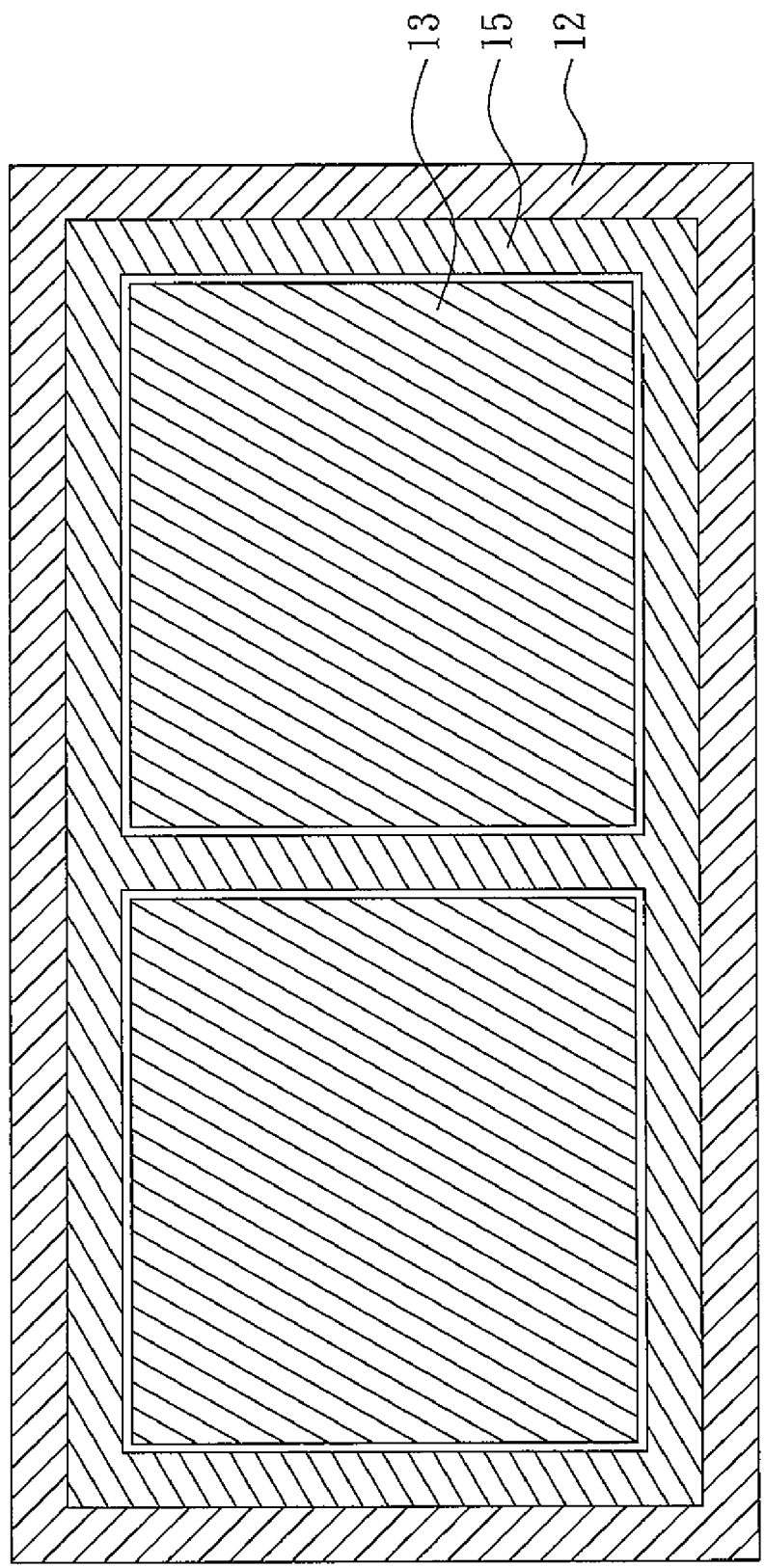

The first layer chip 13 is disposed on the release tape 12. The first back surface 132 of the first layer chip 13 contacts the release tape 12. Preferably, in the embodiment, a metal frame 15 is disposed on the release tape 12. As shown in FIG. 3, the metal frame 15 surrounds the first layer chip 13 and has a portion located between the two first layer chips 13, and the metal frame 15 does not contact the first layer chip 13. Note that the metal frame 15 is not an essential aspect of the present invention.

As shown in FIG. 4, at least one second layer chip 17 is attached and electrically connected to the first layer chip 13. The second layer chip 17 has a second active surface 171 and a plurality of second signal coupling pads 172. The second active surface 171 faces the first active surface 131 of the first layer chip 13. The second signal coupling pads 172 are disposed adjacent to the second active surface 171, and capacitively coupled to the first signal coupling pads 133 of the first layer chip 13, so as to provide proximity communication between the first layer chip 13 and the second layer chip 17. In the embodiment, the second layer chip 17 further comprises a plurality of second layer chip pads 173 disposed adjacent to the second active surface 171, the first layer chip pads 134 are connected to the second layer chip pads 173 by a plurality of conductive element 18. The conductive element 18 may be a micro-solder ball, an anisotropic conductive film (ACF) or an anisotropic conductive paste (ACP). The height of the conductive element 18 is less than about 20 μm.

Figure 6:
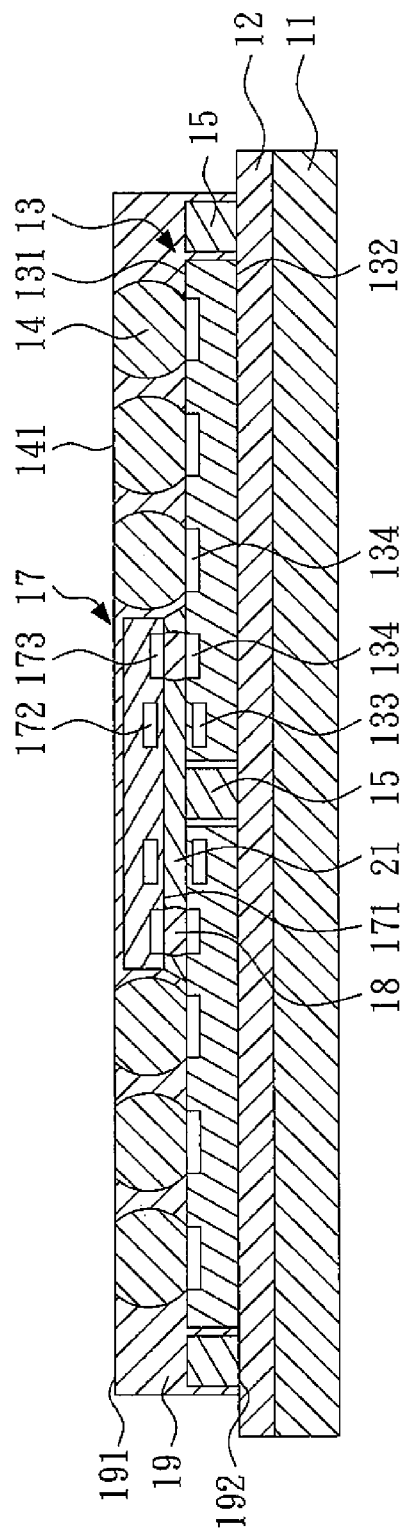
Figure 7:
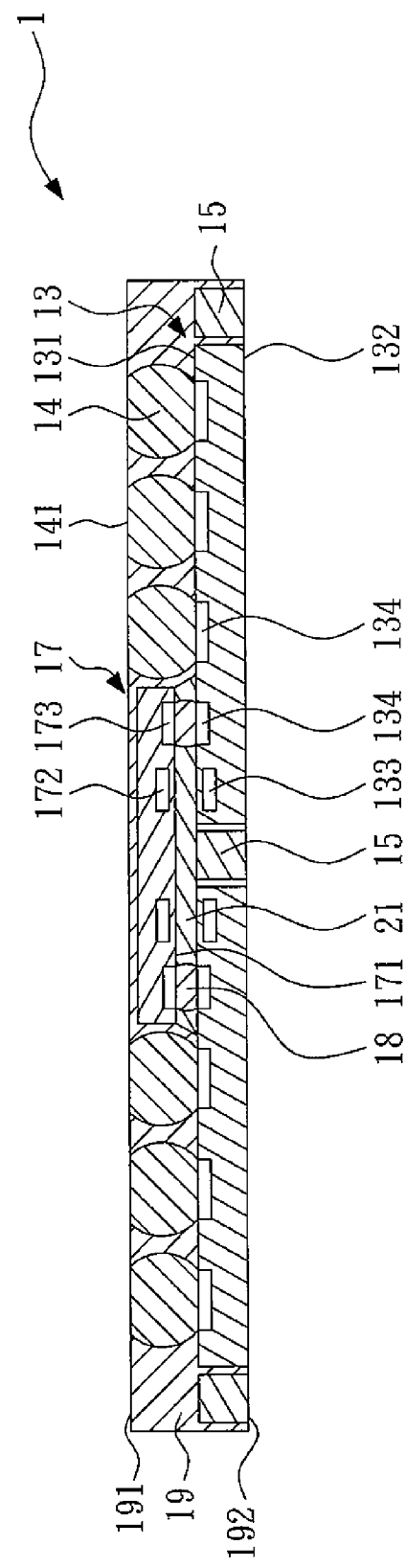

As shown in FIG. 5, a package body 19 is formed to encapsulate the first layer chip 13, the first metal bumps 14 and the second layer chip 17. The package body 19 may be formed by transfer molding a molding compound through a system of runners and gates in a mold. Alternatively, the package body 19 may be formed by a dispensing process. In the embodiment, an underfill 21 is formed between the first layer chip 13 and the second layer chip 17 before forming the package body 19. As shown in FIG. 6, part of the package body 19 is removed so as to expose at least a portion of each of the first metal bumps 14. That is, each of the first metal bumps 14 has at least a portion exposed from the package body 19. As shown in FIG. 7, the release tape 12 and the carrier 11 are removed, and the semiconductor package 1 is formed.

Figure 8:
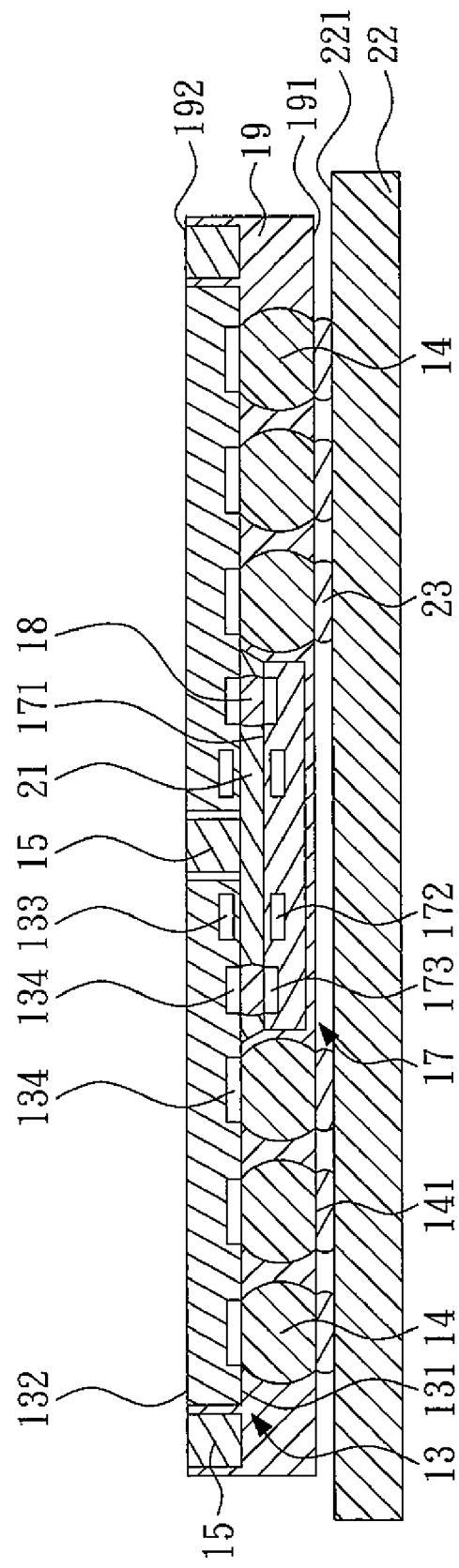

In other embodiment, as shown in FIG. 8, a substrate 22 and a solder paste 23 are further provided. The substrate 22 has a receiving surface 221, and the solder paste 23 is disposed on the receiving surface 221 of the substrate 22. A bonding process is further conducted. The first active surface 131 of the first layer chip 13 faces the receiving surface 221 of the substrate 22, and the first metal bumps 14 contact the solder paste 23.

FIG. 7 shows a cross-sectional view of a semiconductor package according to the present invention. The semiconductor package 1 comprises at least one first layer chip 13, a plurality of first metal bumps 14, at least one second layer chip 17 and a package body 19. In the embodiment, the semiconductor package 1 further comprises an underfill 21, and a metal frame 15.

The first layer chip 13 comprises a first active surface 131 and a plurality of first signal coupling pads 133. The first signal coupling pads 133 are disposed adjacent to the first active surface 131. In the embodiment, the first layer chip 13 further comprises a plurality of first layer chip pads 134 disposed adjacent to the first active surface 131.

The first metal bumps 14 are disposed on the first active surface 131 of the first layer chip 13. In the embodiment, the number of the first layer chip 13 is two, the first metal bumps 14 are connected to one end of each first layer chip 13, and the first signal coupling pads 133 are disposed at another end of each first layer chip 13.

The second layer chip 17 is electrically connected to the first layer chip 13, and comprises a second active surface 171 and a plurality of second signal coupling pads 172. The second active surface 171 faces the first active surface 131 of the first layer chip 13. The second signal coupling pads 172 are disposed adjacent to the second active surface 171, and capacitively coupled to the first signal coupling pads 133 of the first layer chip 13, so as to provide proximity communication between the first layer chip 13 and the second layer chip 17. In the embodiment, the second layer chip 17 further comprises a plurality of second layer chip pads 173 disposed adjacent to the second active surface 171, the first layer chip pads 134 are connected to the second layer chip pads 173 by a plurality of conductive element 18. The conductive element 18 may be a micro-solder ball, an anisotropic conductive film (ACF) or an anisotropic conductive paste (ACP). The height of the conductive element 18 is less than about 20 μm.

The package body 19 encapsulates the first layer chip 13, the first metal bumps 14, the second layer chip 17 and the metal frame 15. Each of the first metal bumps 14 has at least a portion exposed from the package body 19. In the embodiment, a plurality of exposed surfaces 141 of the first metal bumps 14 are coplanar with a first surface 191 of the package body 19, and a first back surface 132 of the first layer chip 13 is coplanar with a second surface 192 of the package body 19.

The underfill 21 is disposed between the first layer chip 13 and the second layer chip 17. The metal frame 15 surrounds the first layer chip 13 and between the two first layer chips 13. The metal frame 15 does not contact the first layer chip 13. The metal frame 15 is embedded in the package body 19.

In other embodiment, as shown in FIG. 8, the semiconductor package 1 may further comprise a substrate 22 and a solder paste 23. The substrate 22 has a receiving surface 221, the solder paste 23 is disposed between the receiving surface 221 of the substrate 22 and the first metal bumps 14, the first layer chip 13 is attached and electrically connected to the receiving surface 221 of the substrate 22 by the first metal bumps 14 and the solder paste 23.

Whereby, the bonding strength between the first layer chip 13 and the second layer chip 17 is increased because of the package body 19, so the yield of the semiconductor package 1 is increased.

It should be noted that the first layer chip 13 and the second layer chip 17 communicate with each other through proximity communication between the first signal coupling pads 133 and the second signal coupling pads 172, instead of direct electrical connections; however, electrical power or ground is transmitted between the first layer chip 13 and the second layer chip 17 through direct electrical connections (the conductive element 18).

In order to achieve the function of proximity communication, part of the first layer chip 13 and the second layer chip 17 are placed face-to-face in a manner that aligns the transmitter circuit with the receiver circuit in extremely close proximity, for example, with only microns of separation between them. The signals between the transmitter circuit and the receiver circuit may be transmitted by inductive or capacitive coupling with low overall communication cost.

Take transmission by capacitive coupling for example. The first signal coupling pads 133 of the first layer chip 13 and the second signal coupling pads 172 of the second layer chip 17 are aligned with each other. Since the first signal coupling pads 133 and the second signal coupling pads 172 are not in physical contact with each other, there are capacitances between the first signal coupling pads 133 of the first layer chip 13 and the second signal coupling pads 172 of the second layer chip 17. It is this capacitive coupling that provides signal paths between the first layer chip 13 and the second layer chip 17. Changes in the electrical potential of the first signal coupling pads 133 of the first layer chip 13 cause corresponding changes in the electrical potential of the corresponding second signal coupling pads 172 of the second layer chip 17. Suitable drivers of the transmitter circuit and sensing circuits of the receiver circuit in the first layer chip 13 and the second layer chip 17 make communication through this small capacitance possible.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:
1. A semiconductor package, comprising:
 at least one first layer chip, comprising:
  a first active surface; and
  a plurality of first signal coupling pads, disposed adjacent to the first active surface;
 a plurality of first metal bumps, disposed on the first active surface of the first layer chip;
 at least one second layer chip, disposed on the first active surface and electrically connected to the first layer chip, comprising:

a second active surface, facing the first active surface of the first layer chip; and a plurality of second signal coupling pads, disposed adjacent to the second active surface, and capacitively coupled to the first signal coupling pads of the first layer chip, so as to provide proximity communication between the first layer chip and the second layer chip; and a package body, encapsulating the first layer chip, the first metal bumps and the second layer chip, wherein each of the first metal bumps has at least a portion exposed from the package body.

2. The semiconductor package as claimed in claim 1, wherein the first layer chip further comprises a plurality of first layer chip pads disposed adjacent to the first active surface, the second layer chip further comprises a plurality of second layer chip pads disposed adjacent to the second active surface, the first layer chip pads are connected to the second layer chip pads by a plurality of conductive element.

3. The semiconductor package as claimed in claim 2, wherein the conductive element is a micro-solder ball, an anisotropic conductive film (ACF) or an anisotropic conductive paste (ACP).

4. The semiconductor package as claimed in claim 2, wherein the height of the conductive element is less than about 20 μm.

5. The semiconductor package as claimed in claim 1, wherein the number of the first layer chip is two, the first metal bumps are connected to one end of each first layer chip, and the first signal coupling pads are disposed at another end of each first layer chip.

6. The semiconductor package as claimed in claim 1, wherein a plurality of exposed surfaces of the first metal bumps are coplanar with a first surface of the package body.

7. The semiconductor package as claimed in claim 1, wherein a first back surface of the first layer chip is coplanar with a second surface of the package body.

8. The semiconductor package as claimed in claim 1, further comprising an underfill disposed between the first layer chip and the second layer chip.

9. The semiconductor package as claimed in claim 1, further comprising a metal frame surrounding the first layer chip, and the metal frame does not contact the first layer chip.

10. The semiconductor package as claimed in claim 1, further comprising a substrate and a solder paste, wherein the substrate has a receiving surface, the solder paste is disposed between the receiving surface of the substrate and the first metal bumps, the first layer chip is attached and electrically connected to the receiving surface of the substrate by the first metal bumps and the solder paste.

11. A semiconductor package, comprising:
at least two first layer chips arranged in a side-by-side configuration, each of the first layer chips comprising:
a first active surface; and
a plurality of first signal coupling pads, disposed adjacent to the first active surface;
a plurality of first metal bumps, disposed on the first active surfaces of the two first layer chips;
at least one second layer chip attached and electrically connected to the two first layer chips, the second layer chip comprising:
a second active surface, facing the first active surface of the first layer chip; and
a plurality of second signal coupling pads, disposed adjacent to the second active surface, and capacitively coupled to the first signal coupling pads of the first layer chip, so as to provide proximity communication between the two first layer chips and the second layer chip; and a package body, encapsulating the first layer chips, the first metal bumps and the second layer chip, wherein each of the first metal bumps has at least a portion exposed from the package body for making external electrical connection.

12. The semiconductor package as claimed in claim 11, wherein the first layer chip further comprises a plurality of first layer chip pads disposed adjacent to the first active surface, the second layer chip further comprises a plurality of second layer chip pads disposed adjacent to the second active surface, the first layer chip pads are connected to the second layer chip pads by a plurality of conductive element.

13. The semiconductor package as claimed in claim 11, wherein the first metal bumps are connected to one end of each first layer chip, and the first signal coupling pads are disposed at another end of each first layer chip.

14. The semiconductor package as claimed in claim 11, wherein a plurality of exposed surfaces of the first metal bumps are coplanar with a first surface of the package body.

15. The semiconductor package as claimed in claim 11, wherein a first back surface of the first layer chip is coplanar with a second surface of the package body.

16. The semiconductor package as claimed in claim 11, further comprising a metal frame surrounding the two first layer chips, and the metal frame does not contact the two first layer chips.

17. A semiconductor package, comprising:
at least two first layer chips, each of the first layer chips comprising:
a first active surface;
a plurality of first layer chip pads, disposed adjacent to the first active surface; and
a plurality of first signal coupling pads, disposed adjacent to the first active surface and at one end of the first layer chip;
a plurality of first metal humps, disposed on the first active surface and at another end of each of the first layer chips;
a second layer chip attached and electrically connected to the ends of the first layer chips, the second layer chip comprising:
a second active surface, facing the first active surfaces of the first layer chips;
a plurality of second layer chip pads disposed adjacent to the second active surface; and
a plurality of second signal coupling pads, disposed adjacent to the second active surface, and capacitively coupled to the first signal coupling pads of the first layer chips, so as to provide proximity communication between the first layer chips and the second layer chip;
a plurality of conductive elements, physically connecting the first layer chip pads and the second layer chip pads; and a package body, encapsulating the first layer chips, the first metal bumps and the second layer chip, wherein each of the first metal bumps has at least a portion exposed from the package body for making external electrical connection.

18. The semiconductor package as claimed in claim 17, wherein a plurality of exposed surfaces of the first metal bumps are coplanar with a first surface of the package body.

19. The semiconductor package as claimed in claim 17, wherein a first back surface of the first layer chip is coplanar with a second surface of the package body.

20. The semiconductor package as claimed in claim 17, further comprising a metal frame surrounding the two first layer chips, and the metal frame does not contact the two first layer chips.

* * * * *